United States Patent [19]

Bainter

[11] 4,028,560

[45] June 7, 1977

[54] CONTACT BOUNCE TRANSIENT PULSE CIRCUIT ELIMINATOR

[75] Inventor: James R. Bainter, Scottsdale, Ariz.

[73] Assignee: Motorola, Inc., Schaumburg, Ill.

[22] Filed: Oct. 8, 1975

[21] Appl. No.: 620,676

Related U.S. Application Data

[63] Continuation of Ser. No. 439,503, Feb. 4, 1974, abandoned.

[52] U.S. Cl. .................. 307/247 A; 307/208; 307/268; 328/164; 340/365 E
[51] Int. Cl.$^2$ ............ H03K 17/56; H03K 5/01
[58] Field of Search ............ 307/247 A, 268, 208; 328/164; 340/365 E

[56] References Cited

UNITED STATES PATENTS

| | | | |
|---|---|---|---|
| 3,471,789 | 10/1969 | Nutting et al. | 307/247 A |
| 3,555,306 | 1/1971 | Cogar et al. | 307/268 |
| 3,624,518 | 11/1971 | Dildy, Jr. | 307/247 A |
| 3,725,680 | 4/1973 | Silva | 307/247 A |
| 3,786,276 | 1/1974 | Rosch | 307/208 |
| 3,795,823 | 3/1974 | Morgan et al. | 307/247 A |
| 3,824,583 | 7/1974 | Turtle | 307/247 A |

OTHER PUBLICATIONS

Designers Casebook, by Wintriss, Electronics, 8/4/69 p. 91.

*Primary Examiner*—Stanley D. Miller, Jr.
*Attorney, Agent, or Firm*—Kenneth R. Stevens

[57] ABSTRACT

A circuit for eliminating transient pulses associated with the opening and closing of a mechanical contact by providing logic and memory circuit means for selectively comparing an input signal supplied from the contact terminal with the output signal from the memory means for either changing the state of the output signal or maintaining the output signal in its existing state. Only a single line connection to the contact terminal is required for supplying both the open and closed electrical signal representations of the contact position.

5 Claims, 4 Drawing Figures

CONTACT BOUNCE TRANSIENT PULSE CIRCUIT ELIMINATOR

This is a continuation of application Ser. No. 439,503, filed Feb. 4, 1974, now abandoned.

BACKGROUND OF THE INVENTION

1. Field of Invention

This invention relates to a circuit for eliminating transient pulses, and more particularly to a memory and logic circuit for eliminating transient pulses generated by undesired intermittent mechanical contact opening and closings.

2. Prior Art

In order to eliminate transient pulses caused by contact bounce during activation or release of a mechanical contact, it has been suggested to employ some form of logic circuit which is responsive to the voltage level and transient pulses caused by contact closure for generating a new signal having well defined leading and trailing edges devoid of the transient pulses. However, these solutions, one of which will be more specifically described hereinafter, suffer from major drawbacks. In some instances, the logic circuitry employed to generate the new signal is extremely costly and difficult to implement in integrated circuit form. Alternatively, and of major importance, the correction of logic generating circuits require that the signal supplied from the contact be transmitted by at least a pair of wires.

The requirement for a pair of lines or wires from the contact structure does not appear significant when considering only a single contact environment. However, the increased cost and complexity of wiring or interconnection becomes magnified many-fold as the number of contacts in the switching arrangement are increased. This problem is further amplified when the switching environment is being adapted for implementation with integrated circuits as size, densities, and wiring complexity are of paramount importance. Additionally, the two wire constraint limits the choice of contact structure available to the designer. Also, the two wire constraint lowers the system reliability due to the additional signal wires, connectors and connections.

SUMMARY OF THE INVENTION

It is therefore an object of the present invention to provide an improved circuit for eliminating transient pulses caused by contact bounce during activation and release.

Another object of the present invention is to provide an improved circuit for eliminating contact bounce while reducing wiring complexities between the contact and the correction or logic circuitry.

Still another object of the present invention is to provide correction circuitry for eliminating transient pulses associated with contact bounce wherein the time delay between the leading edge of the signal being supplied from the contact, and the generated output pulse leading edge is closely controllable and readily alterable.

Another object of the present invention is to provide a circuit primarily intended for eliminating transient pulses caused by contact bounce which is advantageously suitable for implementation in integrated circuit form, and which has additional application in the area of precision clock or delay pulse generation.

In accordance with the aforementioned objects the present invention comprises a single line connection means for supplying input signals representative of a contact open position and a contact closed position to a logic and memory circuit means for generating a transient free output signal. The logic and memory circuit means selectively compares the input and output signals for writing into the memory means in either a erial or parallel mode in order to selectively control the signal state at an output terminal.

DETAILED DESCRIPTION OF PREFERRED EMBODIMENTS

Figure 1:
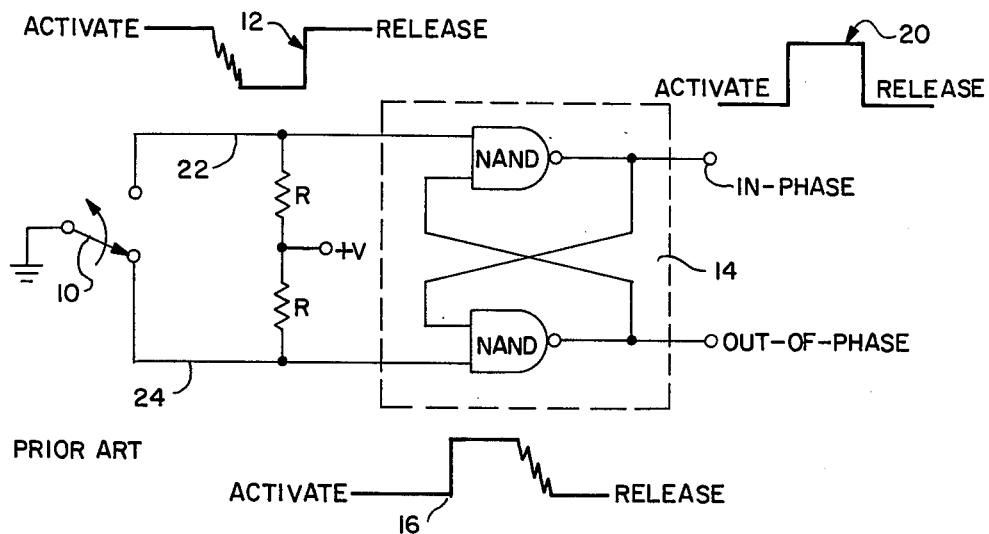
FIG. 1 is a schematic diagram illustrating a prior art circuit for eliminating transient pulses associated with contact bounce.

Now referring to FIG. 1, it illustrates a prior art circuit solution to the occurrence of transient pulses due to contact bounce. Basically, the input contact structure schematically designated at 10, in combiation with a suitable supply source comprising voltage source +V and a pair of load resistors R, supplies an input signal designated 12 to the upper input terminal of latch circuit 14 during activation of the contact arm to the upper terminal, and similarly supplies an input signal depicted at 16 to the lower input terminal during the release or movement of the contact arm from the top terminal down to its bottom terminal. The latch circuit 14 is responsive to the applied signals for generating an output signal represented at 20 having well defined leading and trailing edges, i.e., transient pulses are eliminated.

More specifically, prior to activation or movement of the contact arm to the upper input terminal both inputs to the upper NAND gate of latch circuit 14 are high and thus the in-phase output terminal is low. As the contact arm moves to engage the upper contact, designated as activate, both the input terminals to the upper NAND gate are brought to a low or binary zero state and thus the output signal 20 is in an up level. Similarly, when the contact arm is released or brought into engagement with the lower most contact, both the input terminals to the upper NAND gate are brought to an up state and thus the output signal 20 is down, designated release. However, as previously mentioned, this type of arrangement requires a minimum of two lines 22 and 24 for supplying the signals representative of a contact open or a contact closed position.

Figure 2:
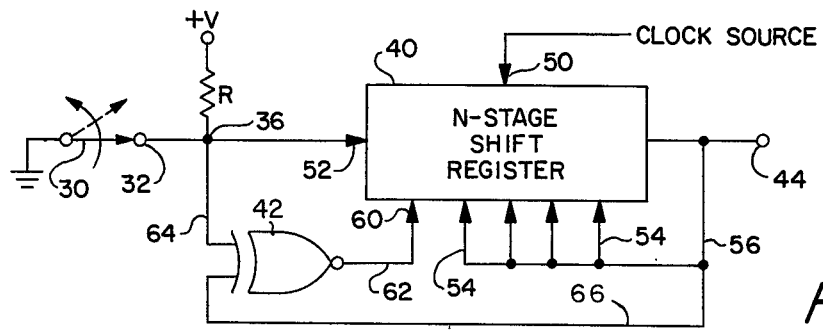
FIG. 2 is a schematic diagram illustrating the preferred embodiment of the present invention.

Now referring to FIG. 2, it illustrates a preferred embodiment of the present invention. A contact arm 30 is illustrated in a closed position. A single contact terminal 32 is employed to engage the contact carrying arm 30 for closing the switch. A suitable voltage supply +V and resistor R in combination with the opening and the closing of contact arm 30 supply input signals to an input terminal 36. This input signal is depicted as waveform 38 in FIG. 3.

In order to generate the desired output signal level a logic and memory circuit means comprising an N stage shift register 40 and an exclusive-NOR circuit 42 is connected to input terminal 36 for generating an output signal on output terminal 44. The output signal delivered to output terminal 44 is depicted as waveform 46 in FIG. 3.

For the purposes of selectively writing information into the shift register 40 there is provided a clock control terminal 50 for supplying clock pulses, a serial write terminal 52, and a plurality of parallel write input terminals generally depicted at 54. The plurality of parallel write input terminals receive data or information fed back from the output terminal 44 by means of line 56. Finally, in order to selectively load the shift register in either a serial mode by means of terminal 52, or in a parallel mode by means of the plurality of terminals 54, the shift register 40 contains a serial-parallel write mode select terminal 60, which in turn is connected to the output terminal of the exclusive-NOR circuit 42 by means of line 62.

The exclusive-NOR circuit 42 is operative to receive signals on line 64 connected to input terminal 36, and on line 66 connected to output terminal 44.

The logic element 42 essentially compares the signal existing at terminals 36 and 44 in order to select either a serial write mode of operation or a parallel write mode of operation. In the preferred embodiment, information only can be written into memory upon the coincidence of a leading clock pulse edge and the existence of information or signals at the serial or parallel input terminals.

OPERATION

For purposes of describing the operation, it is assumed that the shift register 40 comprises four stages and that contact arm 30 is going from a closed to an open position (shown in phantom). In the steady state condition or with contact arm 30 in engagement with contact 32 the input signal applied to terminal 36 is at a level designated at 70, and similarly the output signal is at a level designated 72, that is, a down or binary zero state using positive logic.

When contact between arm 30 and contact 32 is broken, the mechanical inertia of the system causes a series of intermittent openings and closings so as to generate a plurality of transient pulses one of which is shown at 76. Eventually, the input signal reaches a steady level depicted at 78, or at approximately +V volts in this specific example. Thus, an up level is applied to input terminal 52. At this instant of time the exclusive-NOR circuit receives an up level on line 64 and a down level from line 66, as the output signal is still at the level indicated at 72. Accordingly, the exclusive-NOR circuit 42 generates a down level on line 62 so as to select a serial write mode of operation. Accordingly, binary ones are shifted into the register 40 in a serial mode at input terminal 52 with the occurrence of each leading clock pulse edge. It can be seen that for a four stage register the minimum number of clock pulses necessary to load the register is four, if the leading clock pulse edge is substantially time coincident with the initial application of information or input signals to terminal 52. Of course, the maximum number of clock pulses necessary to load the four stage register 40 is five.

After four or five clock pulses an output signal is supplied to output terminal 44, corresponding to up level 80 depicted in waveform 46. At this time, both imputs to exclusive-NOR circuit are now in an up level and thus an up level is generated on output line 62 in order to select a parallel write or load mode of operation. The serial-parallel write mode terminal 60 is thus selectively energized to disable the serial write mode and select a parallel write mode. Up levels or binary ones are thus simultaneously written into the shift register 40 via the plurality of parallel input terminals 54 and propagated therethrough so as to maintain output terminal at an up level 80, subsequent to time delay T.

Thus the exclusive-NOR circuit 42 supplies a down level to select a serial write mode whenever its input terminals reside at opposite levels, and alternatively supplies an up level to select a parallel write mode whenever both the input terminals are at the same level, that is, either both at a binary one or up level, or both at a binary zero or down level.

Figure 3:
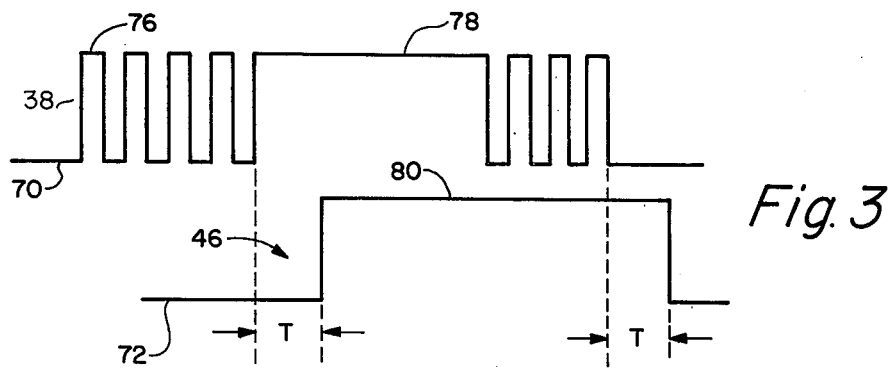
FIG. 3 shows a pair of waveforms illustrating the operation of the preferred embodiment illustrated in FIG. 2.

In the preferred embodiment it can be seen further that the time delay or period, T, depicted in FIG. 3, is equal to (N/F) or (N + 1/f) in the minimum and maximum cases, respectively, where N is the number of shift register stages and $f$ is the frequency of the clock source applied to terminal 50. Thus assuming a 1 kilocycle clock frequency and N equal to 4, the register is loaded in either 4 or 5 milliseconds. Of course, as the clock frequency is varied the delay or period T can be readily varied as desired.

The loading or writing of information into shift register 40 is asynchronous since the data applied to the serial input terminal 52 must await the leading edge of the clock pulse prior to writing, while data written at terminals 54 is accomplished in a synchronous mode.

Figure 4:
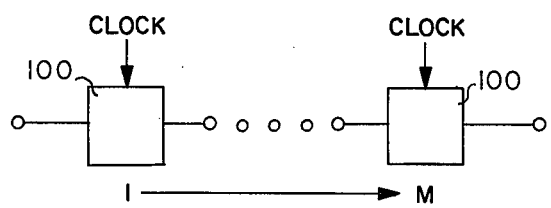
FIG. 4 shows a plurality of circuits of the type illustrated in FIG. 2 being connected in cascade for improving the performance of the preferred embodiment mode, and also illustrating other applications of the basic circuit for clock generation and time delay use.

FIG. 4 illustrates the ease of cascading a plurality of the memory and logic circuits illustrated in FIG. 2. Any number of M logic circuits generally depicted at 100 can be serially connected. In this embodiment the first stage 100, of course, operates in an asynchronous mode, as previously described. However, the succeeding stages can be operated in a synchronous mode. Thus for the given example of a four stage shift register and a clock frequency of 1000 kilocycles it requires four of five milliseconds to write into the first circuit 100 and only four milliseconds for each of the succeeding circuits 100. The overall period T or delay relative to the total number of stages becomes larger as more and more circuits 100 are cascaded, with increased relative accuracy of the delay period T. Thus as M increases, the term (1/f) causes less error.

Although the preferred embodiment is intended to solve the specific problem of contact bounce it can be seen that the FIG. 4 implementation provides a means of generating clock and delay pulses. Also, the operation of FIG. 2 was described only with respect to the leading edge of waveform 38, but of course, operates in a similar manner on the trailing edge.

While the invention has been particularly shown and described in reference to the preferred embodiments thereof, it will be understood by those skilled in the art that changes in form and details may be made therein without departing from the spirit and scope of the invention.

What is claimed is:

1. A circuit for eliminating contact bounce comprising:

a. a single line for transmitting input signals, said input signals comprising a first level and a second level and transient pulses associated therewith, said first and second levels being mutually distinct;

b. logic and memory circuit means having an input terminal and an output terminal, said input terminal being connected to said single line for receiving said input signal at time $t0$, c. said logic and memory means being selectively responsive to said input signal for eliminating said transient pulses associated with either said first and second level and for generating a desired output signal level at time, $0/t1$, at said output terminal after a predetermined time period, T, said output signal level being representative of said input signal received at $t0$, where $T = t1 + t0$;

d. said logic and memory circuit means further comprising a logic means and a memory means;

e. means for connecting said output terminal to said logic means and to said memory means;

f. said logic means being responsive to compare said input signals and said output signal levels for selectively generating first and second control signals;

g. means for connecting said first and second control signals to said memory means;

h. said memory means being selectively responsive to said first control signal for generating and storing a representation of said input signal and transmitting said representation signal to said output terminal after said predetermined time period, T, for changing the output signal level;

i. said memory means being selectively responsive to said second control signal for maintaining said output terminal at its existing output signal level;

j. said memory means further comprising a shift register having N stages, a serial input terminal, N parallel input terminals, and a serial-parallel write mode select terminal, said serial-parallel write mode select terminal being connected to said logic means;

k. said serial-parallel write mode select terminal being responsive to said first control signal for storing and shifting said representation signal through said N stages in a serial mode for changing said output signal level; and said serial-parallel write mode select terminal being responsive to said second control signal for writing the existing output signal level into said N stages for maintaining said output terminal at its existing output signal level.

2. A circuit for eliminating contact bounce as in claim 1 wherein:
   a. said shift register further comprises a clock control terminal for receiving clock pulses for selectively writing into said N stages in both serial and parallel mode at a clock pulse leading edge transition time.

3. A circuit for eliminating contact bounce as in claim 1 wherein:
   a. said logic circuit comprises an exclusive-NOR circuit for generating said first control signal for selecting the serial mode of operation when said input signal and said output signal levels are in opposite levels; and
   b. for generating said second control signal when said input signal and said output signal levels are at the same level.

4. A circuit for eliminating contact bounce as in claim 2 wherein:
   a. said clock terminal is coupled to a clock pulse having a frequency, $f$, and where said time period $(T = N/f)$ minimum, and $(N + 1/f)$ maximum.

5. A circuit for eliminating contact bounce as in claim 4 wherein:
   a. said clock terminal coupled to a variable frequency clock source in order to selectively vary T.

* * * * *